(12) United States Patent
Takasu

(10) Patent No.: US 6,314,016 B1
(45) Date of Patent: Nov. 6, 2001

(54) SEQUENTIAL CIRCUITS USING FERROELECTRICS AND SEMICONDUCTOR DEVICES USING THE SAME

(75) Inventor: Hidemi Takasu, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/388,201

(22) Filed: Sep. 1, 1999

(30) Foreign Application Priority Data

Sep. 2, 1998 (JP) .................................................. 10-247991

(51) Int. Cl.[7] .................................................. G11C 11/22
(52) U.S. Cl. .......................... 365/145; 365/154; 327/202; 327/203; 326/49
(58) Field of Search .................................... 365/145, 154, 365/156; 327/202, 203

(56) References Cited

U.S. PATENT DOCUMENTS

| | | | |
|---|---|---|---|
| 4,809,225 | * 2/1989 | Dimmler et al. | 365/145 |
| 5,361,224 | * 11/1994 | Takasu | 365/145 |
| 5,535,154 | * 7/1996 | Kiyono | 365/154 |
| 5,901,088 | * 5/1999 | Kraus | 365/185.21 |
| 5,923,184 | * 7/1999 | Ooms et al. | 326/50 |
| 6,025,735 | * 2/2000 | Gardner et al. | 326/38 |

* cited by examiner

Primary Examiner—Son T. Dinh
(74) Attorney, Agent, or Firm—Merchant & Gould P.C.

(57) ABSTRACT

It is an object of the present invention to provide a sequential circuit having nonvolatile characteristics capable of holding data therein even when the power supply is shut-off. An inverter circuit INV1 is formed by replacing a pair of transistors consisting the conventional CMOS inverters with transistors NT and PT both having an MFMIS structure. A polarization state corresponding to an ON state is held in a ferroelectric layer 32 of the transistor NT even when the power supply thereof is shut off, and another polarization state corresponding to an OFF state is held in a ferroelectric layer 32 of the transistor PT. The transistors NT and PT are turned into ON and OFF state respectively according to the polarization states held in their ferroelectric layers 32 when the power supply is turned ON again. In this way, the inverter circuit INV1 recovers its state to the state right before the shut-off by turning the power supply into the ON state again.

18 Claims, 15 Drawing Sheets

| POR | R | S | D | Cp | Q | QB |
|---|---|---|---|---|---|---|
| L | H | * | * | * | L | H |
| L | L | L | * | * | H | L |
| L | L | H | H | ↙ | H | L |
| L | L | H | L | ↙ | L | H |
| L | L | H | * | ↙ | NO CHANGE | |
| H | L | H | * | * | RECOVERY TO THE STORED DATA | |

| J | K | Cp | Q | QB |
|---|---|---|---|---|
| H | L | ⎍ | H | L |
| L | H | ⎍ | L | H |
| H | H | ⎍ | OPPOSITE STATE | |
| L | L | ⎍ | NO CHANGE | |
| * | * | ⎎ | NO CHANGE | |

*: "H" OR "L"

| D | Cp | Q | QB |
|---|----|---|-----|
| H | H | H | L |
| L | H | L | H |
| * | L | NO CHANGE | |

*: "H" OR "L"

| IN | OUT |
|---|---|
| H | L |
| L | H |

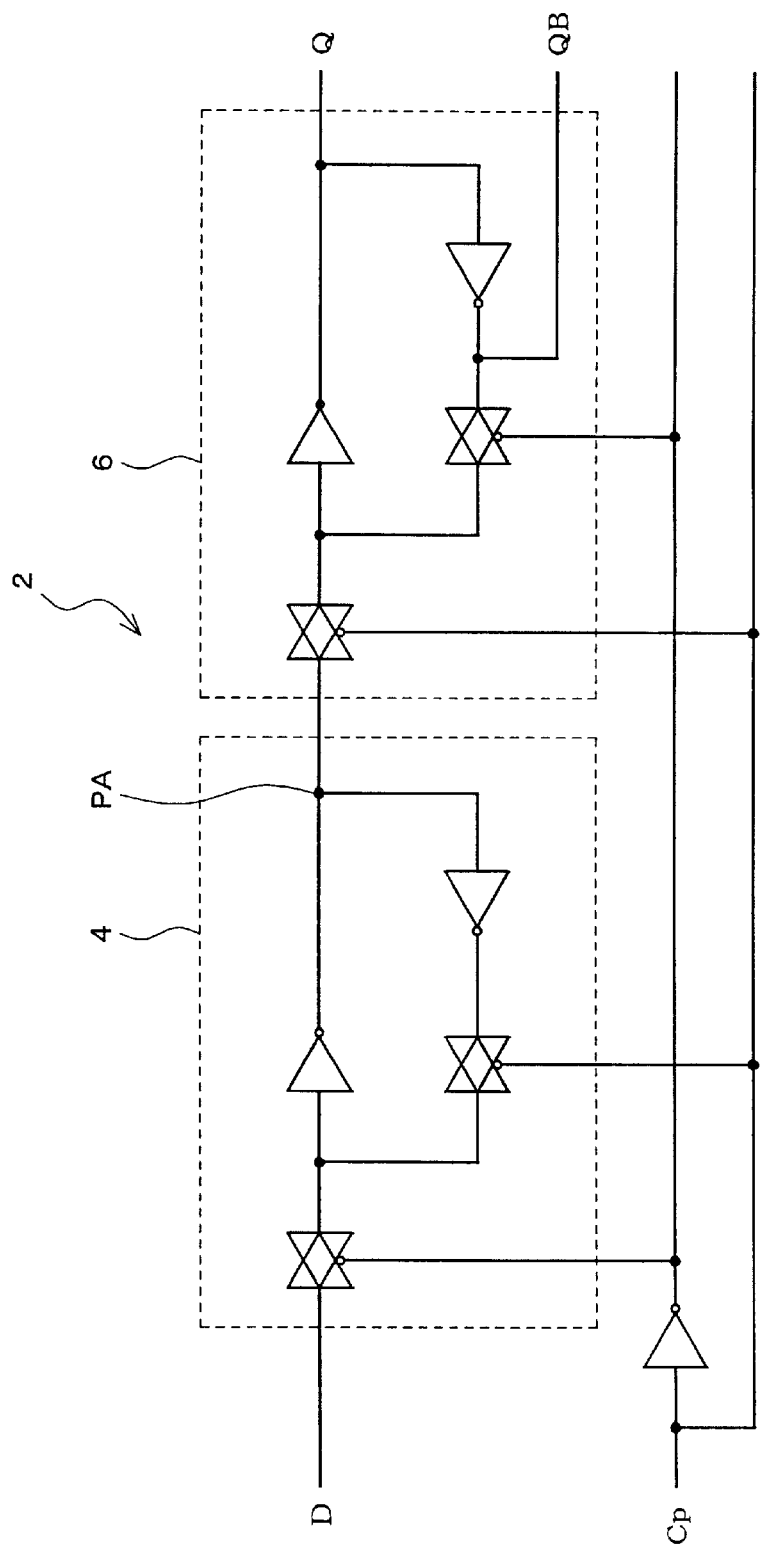
FIG.14 <PRIOR ART>

SEQUENTIAL CIRCUITS USING FERROELECTRICS AND SEMICONDUCTOR DEVICES USING THE SAME

CROSS-REFERENCE TO RELATED APPLICATION

The entire disclosure of Japanese Patent Application No. Hei 10-247991 filed on Sep. 2, 1998 including specification, claims, drawings and summary is incorporated herein by reference in its entirety.

BACKGROUND OF INVENTION

1. Field of the Invention

This invention relates to sequential circuits and similar circuits, more specifically to the sequential circuits and the like using ferroelectrics.

2. Description of the Related Art

Latch circuits and flip-flop circuits are known generally as sequential circuits. A flip-flop circuit 2 depicted in FIG. 14 is an example of the conventional sequential circuit. FIG. 15 is a timing chart for illustrating the operations of the flip-flop circuit 2 depicted in FIG. 14. The flip-flop circuit 2 comprises a latch circuit 4 (serves as the master latch circuit) and another latch circuit 6 (serves as the slave latch circuit) both connected in series. The output of the latch circuit 4 is labeled as "PA" depicted in FIG. 15, that is an output PA shows a signal detected at a point PA shown in FIG. 14.

The latch circuit 4 is turned into the latched-state while turning the latch circuit 6 into the unlatched-state when a clock-pulse Cp becomes "Low" state from "High" state (see FIG. 15(a)). In this way, data corresponding to data Dn (the data provided currently) at the negative edge (High-to-low transition) of the clock pulse Cp (the signal detected at the point PA has a value equivalent to an inverted value of the data Dn) is latched in the latch circuit 4 while outputting the data Dn to an output terminal Q.

Subsequently, the latch circuit 4 is turned into the unlatched-state while turning the latch circuit 6 into the latched-state when a clock-pulse Cp becomes "High" state from "low" state (see FIG. 15(b)). In this way, the data Dn is latched in the latch circuit 6 while outputting the data Dn again to the output terminal Q.

Thereafter, the latch circuit 4 is turned into the latched-state again while turning the latch circuit 6 into the unlatched-state when a clock-pulse Cp becomes "Low" state from "High" state (see FIG. 15(c)). In this way, data corresponding to the data Dn+1 (the data provided subsequently) at the negative edge (high-to-low transition) of the clock pulse Cp (the signal detected at the point PA has a value equivalent to an inverted value of the data Dn) is latched in the latch circuit 4 while outputting the data Dn+1 to the output terminal Q.

As described above, the data thus latched can be outputted within a duration equivalent to one complete cycle of the clock pulse Cp by latching data at the negative edge of the clock pulse Cp as a result of using the flip-flop circuit 2. Consequently, stable outputs without noises can be obtained.

Sequential processings having a high reliability can be performed by using a combination of a plurality of sequential circuits such as the flip-flop circuit 2 and combined circuits such as logical gates.

The conventional sequence circuit such as the flip-flop circuit 2, however, has the following problems to be solved. Adequate voltages must be applied to the circuit all the time in order to hold the data being processed.

Data being processed under sequential processings and that stored in a memory is completely erased when the power supply is shut off by an accident. The data can not be recovered even after the recovery of the power supply. In order to recover the data into the original one just before the accident, another sequential processings must be performed again from its beginning. It consumes much time to perform the sequential processings for every accident, and the data erase cause lack of processing reliability.

SUMMARY OF THE INVENTION

It is an object of the present invention to overcome the above mentioned drawbacks on the sequential circuits such as the flip-flop circuit associated with the prior art, and to provide sequential circuits realizing nonvolatile sequential circuits capable of holding data even when the power supply thereof is shut off.

In accordance with characteristics of the present invention, there is provided sequential circuit having a gate portion for switching input data according to a gate control signal provided thereto, the sequential circuit outputting a signal corresponding to the input data as output data when the gate portion is in an ON-state, the sequential circuit holding input data which is inputted substantially at right before an OFF-state of the gate portion while outputting a signal corresponding to the input data held therein as output data when the gate portion is in the OFF-state, the sequential circuit comprises:

a ferroelectric memorizing portion connected to an output terminal of the gate portion and holding a polarization state corresponding to a signal provided to the output terminal.

In accordance with characteristics of the present invention, there is provided a complementary metal-oxide inverter circuit connecting a p-channel metal-oxide-semiconductor field effect transistor and an N-channel metal-oxide-semiconductor field effect type transistor in series, wherein at least one of the transistors is formed of a ferroelectric transistor.

A word "ferroelectric memorizing portion" used in claims represents a portion which stores data by using hysteresis of ferroelectrics. In a concrete form, the ferroelectric memorizing portion includes a ferroelectric transistor and a ferroelectric capacitor, not only those, a circuit or equivalents combining these may be included.

Further, a word "a ferroelectric transistor" used in claims represents a transistor using ferroelectrics such as a transistor having a structure so called MFMIS and an MFS-structured transistor both of which will be described subsequently. In the preferred embodiments, transistors NT and PT shown in FIG. 1 form the ferroelectric transistor.

While the novel features of the invention are set forth in a general fashion, both as to organization and content, the invention will be better understood and appreciated, along with other objects and features thereof from the following detailed description taken in conjunction with the drawings.

BRIEF DESCRIPTION OF THE DRAWINGS

FIG. 9 is a truth table showing the operating conditions of the flip-flop circuit 12.

FIG. 14 is a circuit diagram of a flip-flop circuit 2 as an example of the prior art sequential circuit.

DETAILED DESCRIPTION OF THE PREFERRED EMBODIMENT

Figure 1:
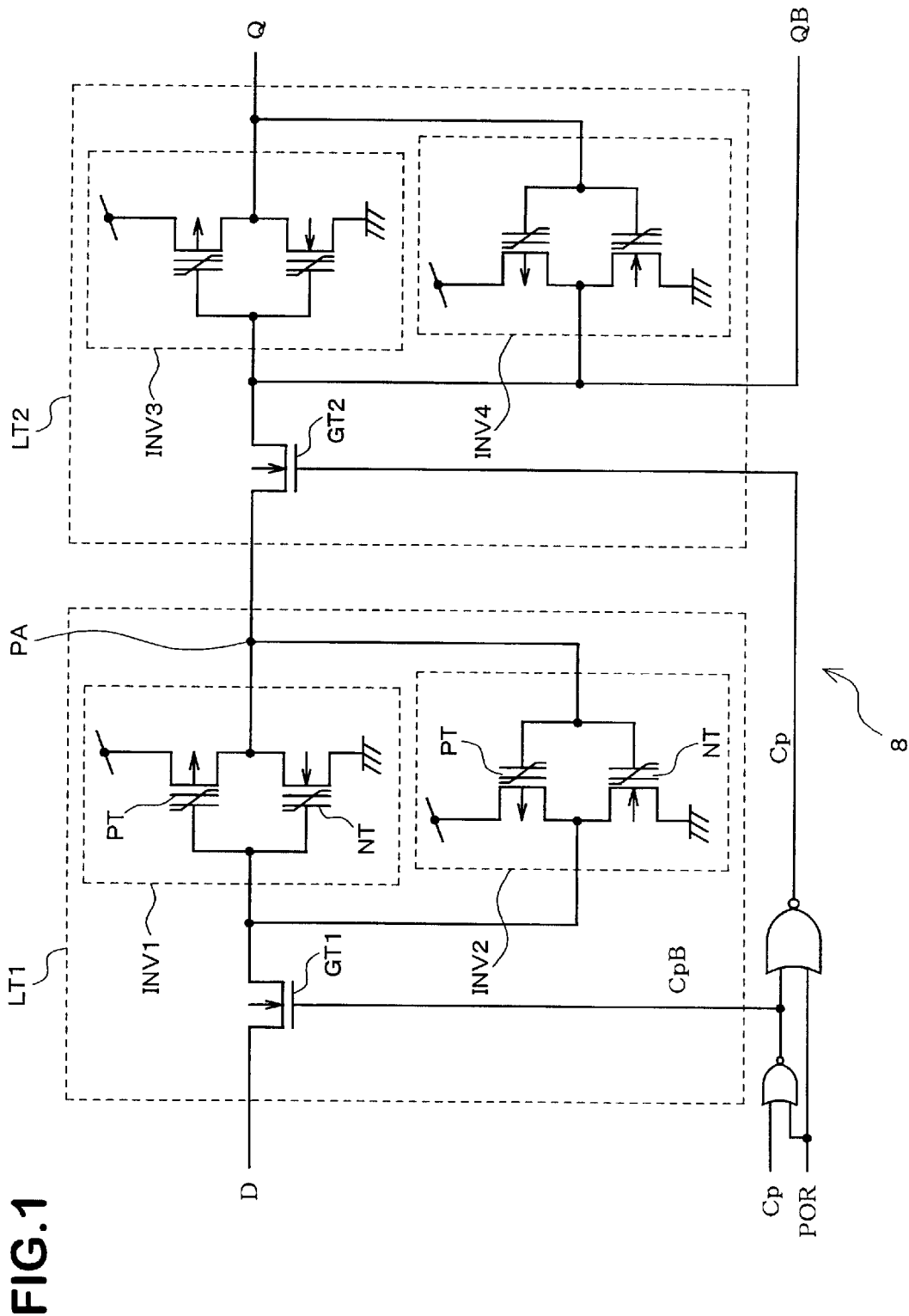
FIG. 1 is a circuit diagram showing a flip-flop circuit 8 which forms a sequential circuit used in an embodiment of a semiconductor device according to the present invention.

FIG. 1 is a circuit diagram showing a flip-flop circuit 8 which forms a sequential circuit used in an embodiment of a semiconductor device according to the present invention. The flip-flop circuit 8 is a basic D flip-flip circuit having a structure in which a latch circuit LT1 (serves as a master latch circuit) and another latch circuit LT2 (serves as the slave latch circuit) both also forming the sequential circuit are connected in series.

The latch circuit LT1 comprises a transistor GT1 (an N channel MOSFET) forming a gate portion, inverter circuits INV1 and INV2. The inverter circuit INV1 is a CMOS inverter circuit in which a transistor PT forming a P channel MOSFET and a transistor NT acting as an N channel are connected in series.

Both the transistor NT and the transistor PT are ferroelectric transistors having a structure so called MFMIS (a metal layer, a ferroelectric layer, another metal layer, an insulation layer, and a silicon layer are formed one after another from the top in secession).

Figure 3A:
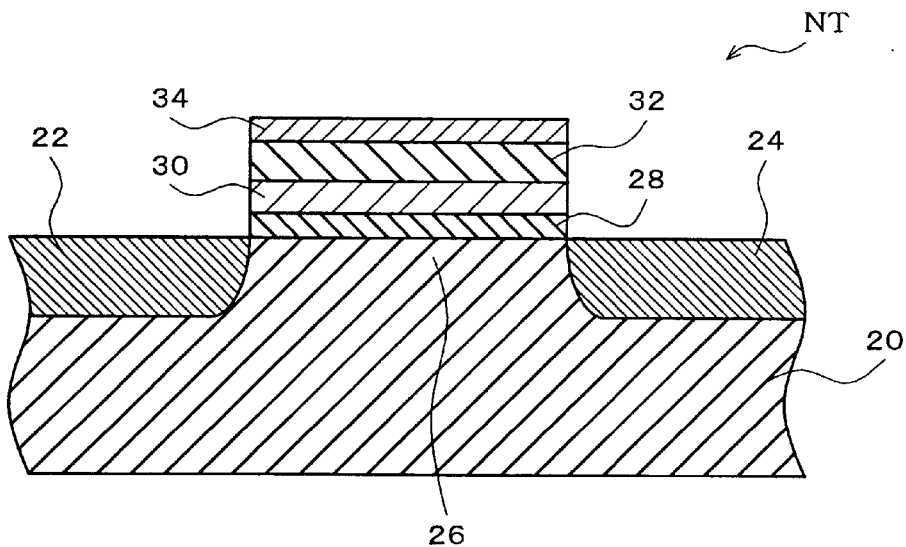
FIG. 3A is a sectional view illustrating the structure of a transistor NT which is used in the flip-flop circuit 8.

FIG. 3A is a sectional view illustrating the structure of a transistor NT depicted in FIG. 1. A source region 22 and a drain region 24 both of n-type (first conductive type) semiconductor are formed in a silicon substrate 20 of p-type which forms a semiconductor substrate. On a channel formation region 26 of a p-type (second conductive type) semiconductor, an insulation layer 28 made of silicon oxidation ($SiO_2$) is formed. A lower conductive layer (a first conductive layer) 30 is a layer sequence comprise in secession of a poly-silicon (Poly-Si) layer, an iridium oxide ($IrO_2$) layer, and an iridium (Ir) layer formed on the insulation layer 28.

A ferroelectric layer 32 made of PZT and the like is formed on the lower conductive layer 30. Polarization states corresponding to the ON/OFF state of the transistor NT are held therein as will be described subsequently.

An upper conductive layer (a second conductive layer) 34 made both of an iridium oxide ($IrO_2$) layer, and an iridium (Ir) layer formed in that order is located on the ferroelectric layer 32.

The insulation layer 28 can also be formed with silicon nitride (SiN) or the like instead of the layers stated above. Further, the lower conductive layer 30 and the upper conductive layer 34 can be formed with oxide conductive materials such as ruthenium oxide (RuOx), indium tin oxide (ITO) or metals such as platinum (Pt), lead (Pb), gold (Au), silver (Ag), aluminum (Al), nickel (Ni) and the like.

Figure 3B:
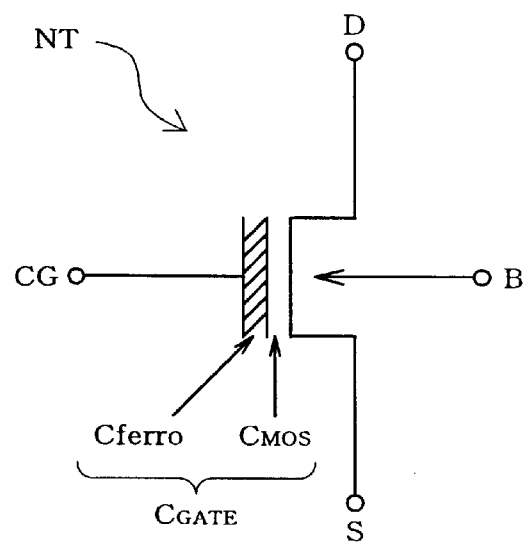
FIG. 3B is a view illustrating a schematic symbol of the transistor NT shown in FIG. 3A.

FIG. 3B is a view illustrating a schematic symbol of the transistor NT shown in FIG. 3A. A control gate electrode CG is connected to the upper conductive layer 34. The lower conductive layer 30 is made under a floating state because no electrodes are connected thereto. A source electrode S and a drain electrode D are connected to the source region 22 and the drain region 24 respectively.

The control gate electrode CG (an input terminal of the inverter circuit) and the drain electrode D (an output terminal of the inverter circuit) are connected respectively to an output terminal of the transistor GT1 in the latch circuit LT1 and an input terminal of the transistor GT2 in the latch circuit LT2, and the source electrode S is grounded.

Both the transistors NT and PT have the same structures except that one of them includes an N channel type MOSFET and the other has a P channel type MOSFET. In other words, the transistor PT is also a ferroelectric transistor having a structure so called MFMIS structure.

Now, referring back to FIG. 1, although the structure of the inverter circuit INV2 is similar to that of the inverter circuit INV1, the drive capability of current of the inverter circuit INV1 is higher than that of the inverter circuit INV2. In this embodiment, the inverter circuit INV1 and the inverter circuit INV2 respectively form a ferroelectric memorizing portion and a feed-back circuit.

An input data D inputted through the transistor GT1 is inverted with the inverter circuit INV1, then the inverted data is again inverted (it is made to the inputted data D) with the inverter circuit INV2. The resultant data is provided again to the inverter circuit INV1. In other words, data can be held with a high stability by using the feed-back circuit including the inverter circuit INV2.

The output (output data) of the inverter circuit INV1 in the latch circuit LT1 is also inputted into the latch circuit LT2. The structure of the latch circuit LT2 is also similar to that of the latch circuit LT1, or comprising a transistor GT2 forming the gate portion, an inverter circuits INV3 and INV4. The structure of the transistor GT2, the inverter circuits INV3 and INV4 are respectively similar to that of the counterparts such as the transistor GT1, the inverter circuits INV1 and INV2.

The operations of the latch circuit LT2 is similar to that of the latch circuit LT1. That is, the data outputted by the inverter circuit INV1 which is inputted to the inverter circuit INV3 through the transistor GT2 is inverted with the inverter circuit INV3, then the inverted data is inverted again (it is made to the inputted data) with the inverter circuit INV4. The resultant data is provided to the inverter circuit INV3. In other words, data can be held with a high stability by using the feed-back circuit including the inverter circuit INV4.

The output of the inverter circuit INV3 in the latch circuit LT2 becomes an output data Q of the flip-flop circuit 8. Further, the output of the inverter circuit INV4 in the latch circuit LT2 comes to an inverted output data QB of the flip-flop circuit 8.

Clock pulses CP serve as a gate control signal are provided to the gate of the transistor GT2 in the latch circuit LT2, and another clock pulses CpB (control signal) serve as inverted signals of the clock pulses CP are supplied to the gate of the transistor GT1 in the latch circuit LT1. In order to turn both the transistors GT1 and GT2 into OFF state only in a certain period of time just after turning the power supply ON, a signal for power on reset operations (hereinafter referred to as POR signal) is provided such that the signal is in "High" at first and then become "Low".

Figure 15:
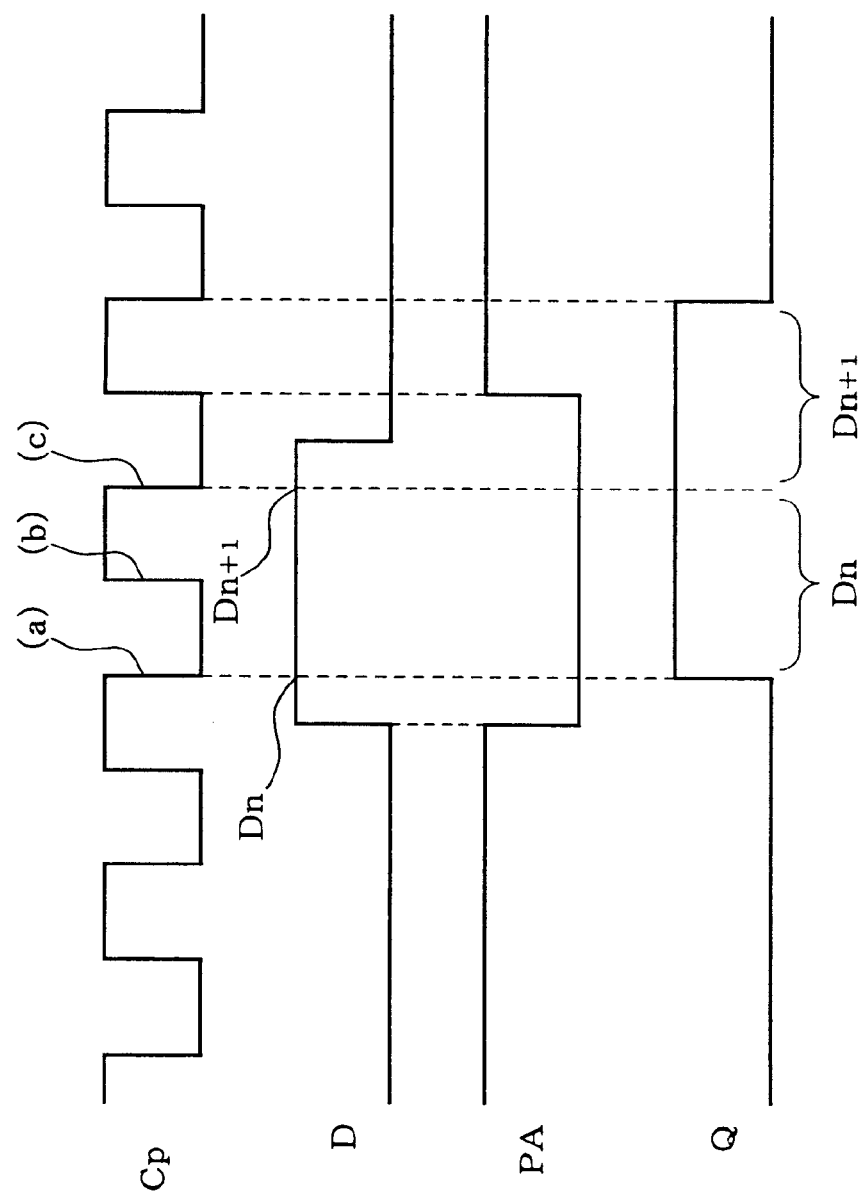
FIG. 15 is a timing chart showing the operating conditions of the flip-flop circuit 2 depicted in FIG. 14.

The operations of the flip-flop circuit 8 is similar to that of the prior art flip-flop circuit 2 (see FIG. 15) depicted in FIG. 14, but it is different from the prior art flip-flop circuit in view of holding data even when the power supply is shut off. Unlike to the prior art flip-flop circuit 2, the input data D is latched in the flip-flop circuit 8 when a clock-pulse Cp is at a positive edge (Low-to-high transition) in this embodiment.

Detailed operations of the flip-flop circuit 8 will be described with reference to a timing chart shown in FIG. 2. The output of the latch circuit LT1 is also labeled as PA, that is, an output PA depicted in FIG. 2 shows signals detected at the point PA shown in FIG. 1.

Figure 2:
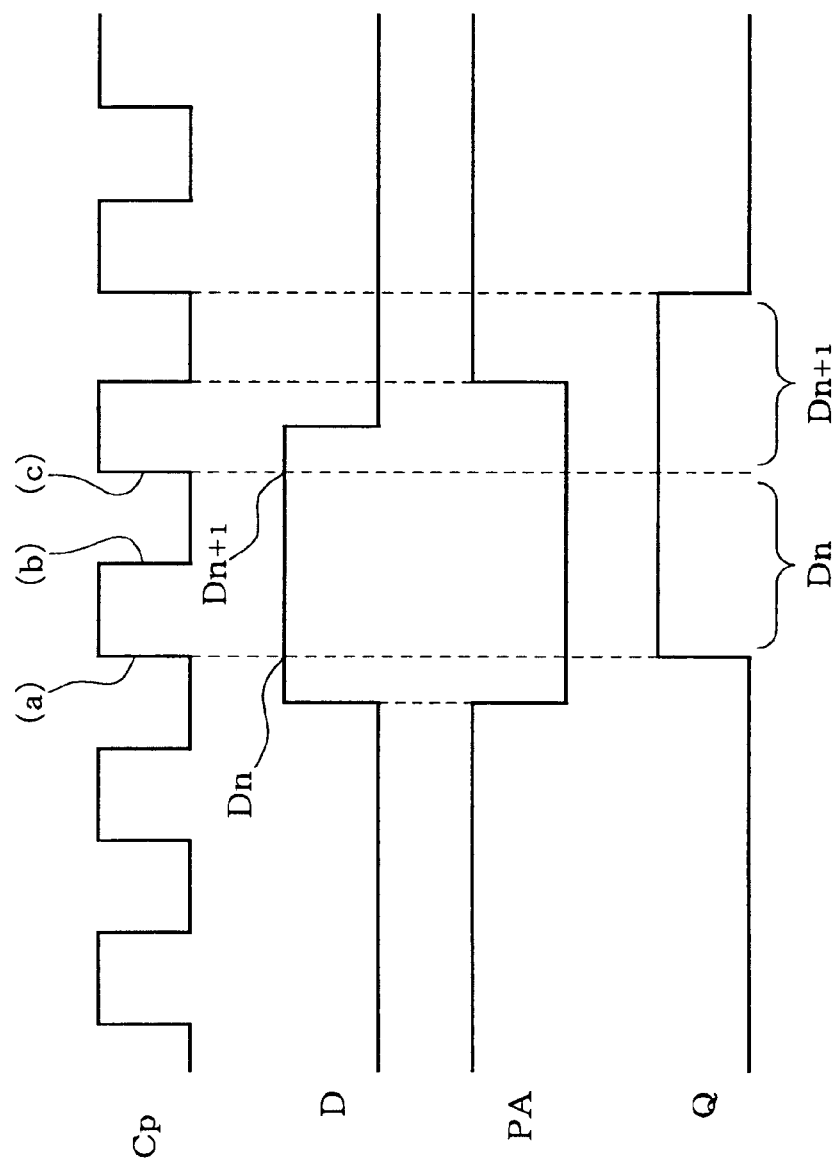
FIG. 2 is a timing chart for describing the operations of the flip-flop circuit 8 depicted in FIG. 1.

The transistor GT2 is turned into ON state while turning the transistor GT1 into OFF state when a clock-pulse Cp becomes "High" state from "Low" state (see FIG. 2 (a)). In this way, data corresponding to data Dn (the data currently applied) at a positive edge (Low-to-high transition) of a clock pulse Cp (the signal detected at the point PA has a value equivalent to an inverted value of the data Dn) is latched in the latch circuit LT1 while outputting the data Dn to the output terminal Q.

Subsequently, the transistor GT2 is turned into OFF state while turning the transistor GT1 into ON state when another clock-pulse Cp becomes "Low" state from "High" state (see FIG. 2(b)). In this way, the data Dn is latched in the latch circuit LT2 while outputting the data Dn again to the output terminal Q.

Next, the latch circuit LT2 is turned into On state while turning the latch circuit LT1 into OFF state again when another clock-pulse Cp becomes "High" state from "Low" state (see FIG. 2(c)). In this way, data corresponding to the data Dn+1 (subsequent data) at the positive edge (Low-to-high transition) of the clock pulse Cp (the signal detected at the point PA has a value equivalent to an inverted value of the data Dn) is latched in the latch circuit LT1 while outputting the data Dn+1 to the output terminal Q.

In this way, the data thus latched can be outputted within a duration equivalent to one complete cycle of the clock pulse Cp by latching data at the positive edge of the clock pulse Cp as a result of using the flip-flop circuit 8.

As described above, the flip-flop circuit 8 holds the data therein even when the power supply is shut off, that is different from the prior art flip-flop circuit 2. Operations carried out for data holding and data reproduction will be described hereunder.

Figure 4:
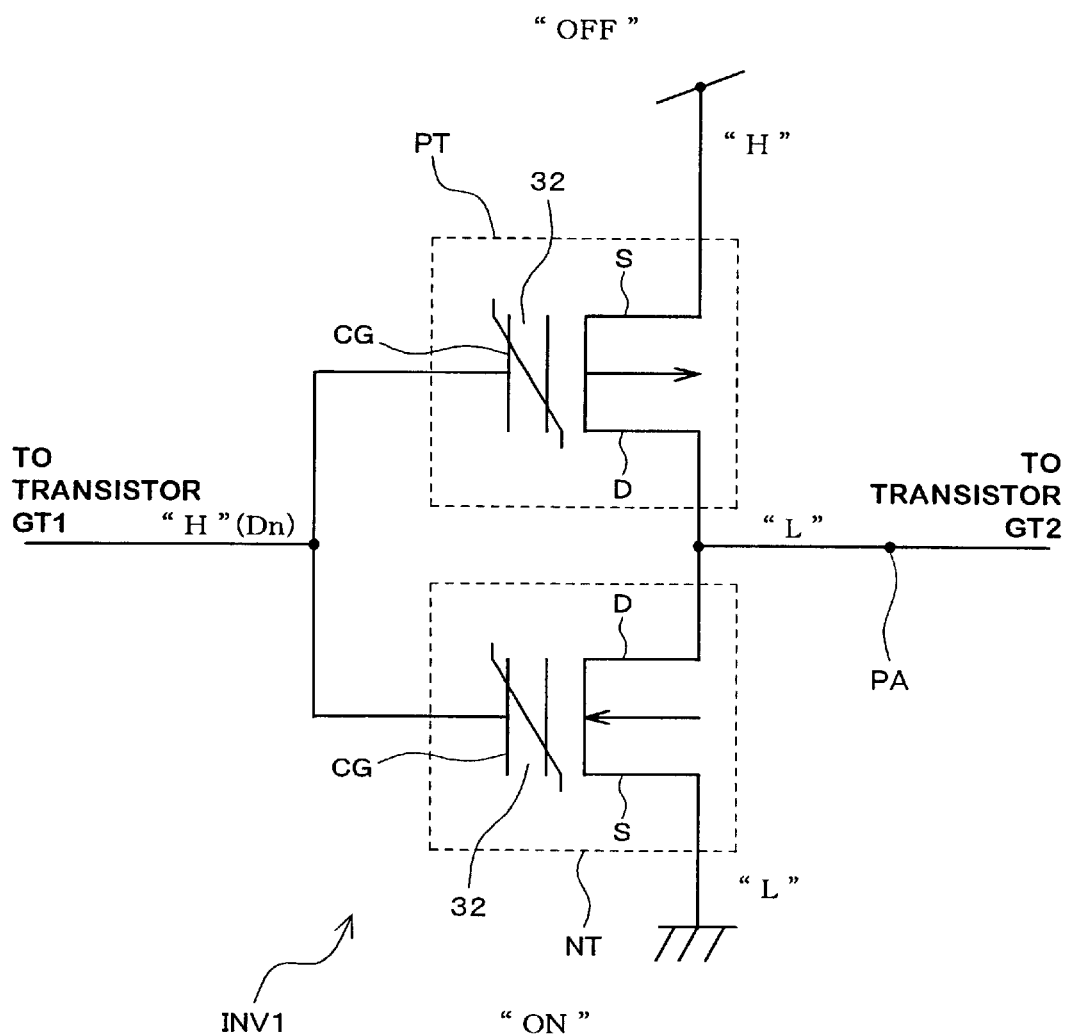
FIG. 4 is a circuit diagram of an inverter circuit INV1 for describing the operations for storing data "High" in a latch circuit LT1.

Data Dn (data "High" in this embodiment) at right before a clock pulse Cp becoming "High" state (see FIG. 2 (a)), that is the clock-pulse Cp is at a low-to-high transition, is latched in the latch circuit LT1. FIG. 4 is a circuit diagram of the inverter circuit INV1 which shows conditions thereof at right before the condition shown in FIG. 2(a).

As shown in FIG. 4, a voltage representing "Low" is applied to a source electrode S of the transistor NT, and a voltage representing "High" is provided to a source electrode S of the transistor PT.

A voltage representing "High" is applied to control gates CG of both transistors NT and PT. Threshold voltages $V_{th}$ of the transistors NT and PT are respectively set in such a manner that the transistors NT and PT are tuned into "ON" state and "OFF" state respectively when the voltage "High" is applied to both the control gates CG. Consequently, drain electrodes D of both the transistors NT and PT are turned into a "low" electric potential in this case.

Under the conditions, predetermined polarization states occur within the ferroelectric layers 32 of the transistors NT and PT as will be described subsequently. In other words, data "High" is latched in the latch circuit LT1 as the predetermined polarization states generated within the ferroelectric layers 32 of the transistors NT and PT.

Thereafter, although the transistor GT1 is turned into OFF state when the clock pulse Cp becomes "High" state from "Low" state, both ON state of the transistor NT and OFF state of the transistor PT are held as a result of a mechanism so called "self-latching" performed with the inverter circuits INV1 and INV2. In other words, data "High" is latched in the latch circuit LT1.

Conditions of the transistors NT and PT from writing of the data "High" through the data latching will be described hereunder. Firstly, the conditions of the transistor NT will be described.

The transistor NT may be assumed as two capacitors such as a ferroelectric capacitor $C_{ferro}$ formed between the upper conductive layer 34 and the lower conductive layer 30, and a MOS capacitor $C_{MOS}$ formed between the lower conductive layer 30 and the channel region 26, both of which are connected to each other in series as shown in FIG. 3A and 3B. The capacitor incorporates both the ferroelectric capacitor $C_{ferro}$ and the MOS capacitor $C_{MOS}$ is referred to as a capacitor $C_{GATE}$.

Figure 5:
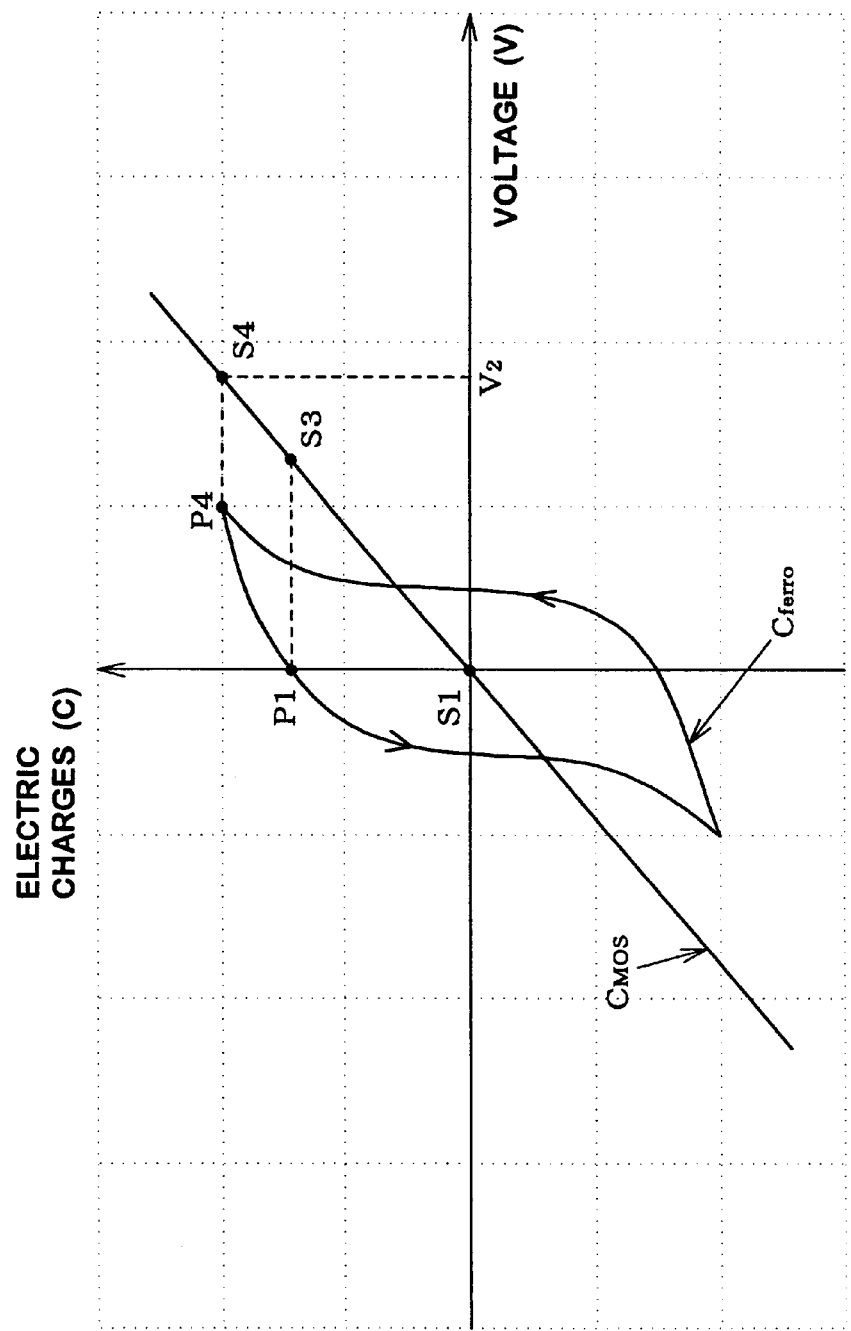
FIG. 5 is a graph showing voltage/charge characteristics of a ferroelectric capacitor $C_{ferro}$ and an MOS capacitor $C_{MOS}$ when data "High" is stored in the latch circuit LT1, both the capacitors included in the transistor NT.

FIG. 5 is a graph showing an example of voltage/charge characteristics of both the ferroelectric capacitor $C_{ferro}$ and the MOS capacitor $C_{MOS}$ of the transistor NT when the data "high" is written in the latch circuit LT1.

Electric potential of the channel region 26 (see FIG. 3A) is substantially equivalent to the ground voltage because the transistor NT is turned into ON state (see FIG. 4) as described above. Further, the voltage representing "High (the power supply voltage $V_{DD}$)" is applied to the control gate electrode CG of the transistor NT. In this way, the power supply voltage $V_{DD}$ having a polarity of positive which is determined based on the electric potential of the channel region 26 is applied to the capacitor $C_{GATE}$.

As a result, the condition of the voltage and the electric charges existing in the ferroelectric capacitor $C_{ferro}$ is in a point P4 as shown in FIG. 5. Similarly, the condition of the voltage and the electric charges existing in the MOS capacitor $C_{MOS}$ is in a point S4. An electric charge indicated at the point S4 is equivalent to an electric charge shown as the point P4. At that time, the voltage existing in the MOS capacitor $C_{MOS}$, that is a voltage generated in the lower conductive layer 30 (forming a floating gate), is in a voltage $V_2$.

Figure 6:
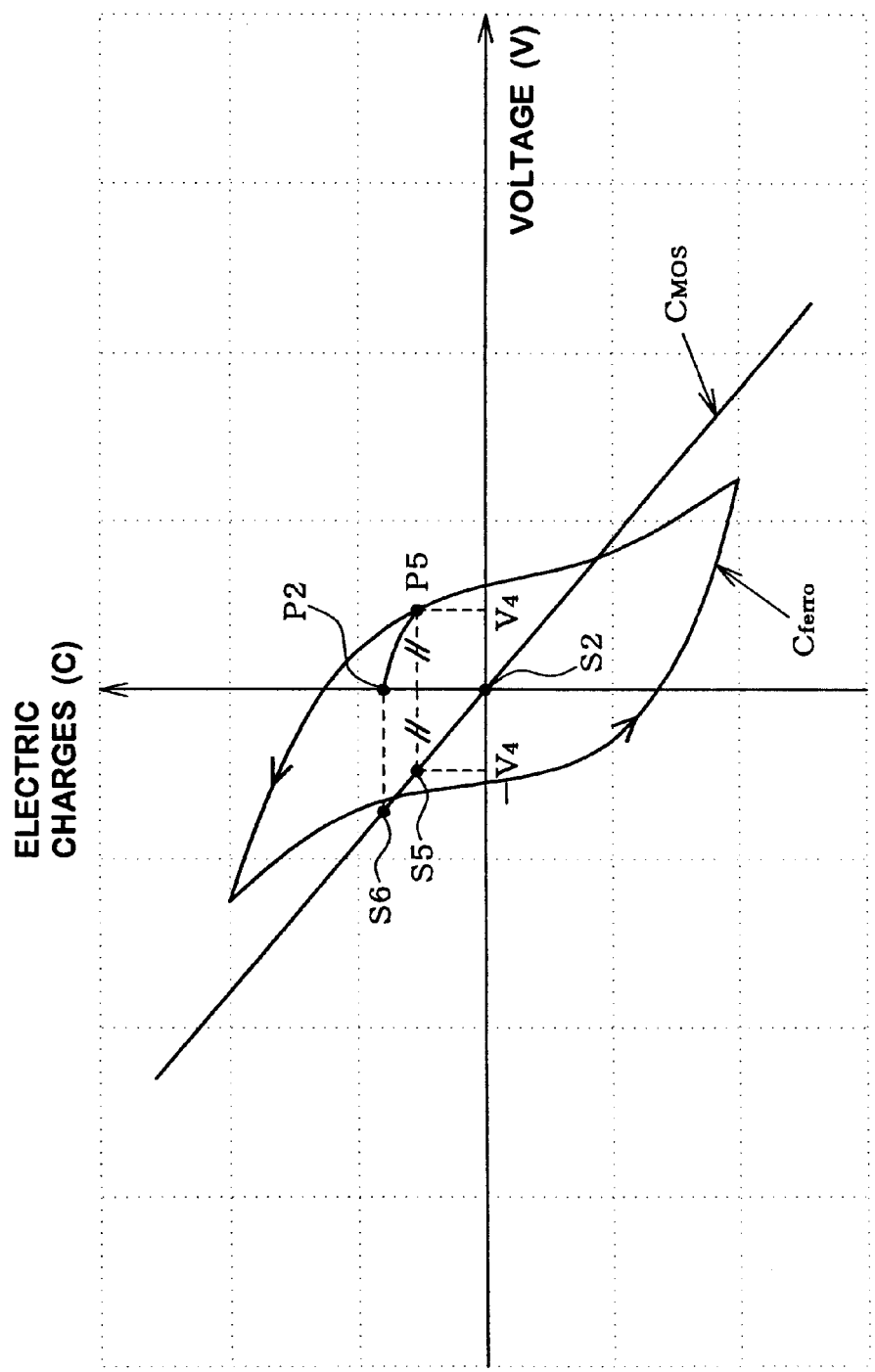
FIG. 6 is a graph showing voltage/charge characteristics of a ferroelectric capacitor $C_{ferro}$ and an MOS capacitor $C_{MOS}$ when data "High" is stored in the latch circuit LT1, both the capacitors included in the transistor PT.

Secondly, the conditions of the transistor PT will be described. FIG. 6 is a graph showing voltage/charge characteristics of the capacitor $C_{ferro}$ and the MOS capacitor $C_{MOS}$ both in the transistor PT when the data "High" is stored in the latch circuit LT1.

Electric potential of the channel region 26 is substantially equivalent to the power supply voltage $V_{DD}$ because the transistor PT shown in FIG. 4 is turned into OFF state as described above. Further, the voltage representing "High (the power supply voltage $V_{DD}$)" is applied to the control gate electrode CG of the transistor PT. In this way, a voltage equivalent to zero volt which is determined based on the electric potential of the channel region 26 is applied to the capacitor $C_{GATE}$.

As a result, the condition of the voltage and the electric charges existing in the capacitor $C_{ferro}$ is moved to a point P5, and the condition thereof in the MOS capacitor $C_{MOS}$ is also changed to the point S5 as shown in FIG. 6. The electric charges illustrated in the point P5 is equivalent to that illustrated at the point S5 because the ferroelectric capacitor $C_{ferro}$ and the MOS capacitor $C_{MOS}$ are connected with each other in series. A sum total of the voltages illustrated at the points P5 and S5 is supposed to be in zero volt. Therefore, the voltage at the point S5 is illustrated as a voltage $-V_4$ which has the same absolute value and opposite in the sign to the voltage at the point P5 when the voltage at the point P5 is identified as a voltage $V_4$.

Next, operations of the flip-flop circuit 8 are described hereunder when the power supply of which (not shown) is shut off once and is turned on later. Firstly, the conditions of the transistor NT will be described.

The voltages and the electric charges illustrated in both the point P4 and the point S4 shown in FIG. 5 respectively existed in both the ferroelectric capacitor $C_{ferro}$ and the MOS capacitor $C_{MOS}$ in the transistor NT are varied to the point P1 and the point S1 respectively with the time elapsed when the power supply of the flip-flop circuit 8 is turned off while remaining the data "High" in the latch circuit LT1.

The voltage and electric charge existed in the MOS capacitor $C_{MOS}$ is varied rapidly to a point S3 from the point S1 soon after turning on the power supply when the power supply of the flip-flop circuit 8 is turned on again. The value of the electric charge illustrated in a point S3 is equivalent to that shown as the point P1.

Thereafter, the voltages and the electric charges respectively existed in both the ferroelectric capacitor $C_{ferro}$ and the MOS capacitor $C_{MOS}$ are moved to the point P4 and the point S4 shown in FIG. 5 respectively with the time elapsed. At that time, the voltage at the MOS capacitor $C_{MOS}$, that is, the voltage generated at the floating gate, is detected as the voltage $V_2$. In other words, the transistor NT is turned into ON state, just like the state at right before the shut-off of the power supply.

The condition of the voltages and the electric charges existing in the ferroelectric capacitor $C_{ferro}$ is returned to the point P4 from the point P1 as shown in FIG. 5. Similarly, the condition of the voltages and the electric charges existing in the MOS capacitor $C_{MOS}$ is returned to the point S4 from the point S1 through the point S3.

Subsequently, the conditions of the transistor PT will be described hereunder. The voltages and the electric charges illustrated in both the point P5 and the point S5 shown in FIG. 6 respectively existed in both the ferroelectric capacitor $C_{ferro}$ and the MOS capacitor $C_{MOS}$ in the transistor PT are varied to the point P2 and the point S2 (similar to the point S1 shown in FIG. 5) respectively with the time elapsed when the power supply of the flip-flop circuit 8 is turned off while remaining the data "High" in the latch circuit LT1.

The voltage and electric charge existed in the MOS capacitor $C_{MOS}$ is varied rapidly to a point S6 from the point S2 soon after turning on the power supply when the power supply of the flip-flop circuit 8 is turned on again. The value of the electric charge illustrated in the point S6 is equivalent to that shown as the point P2.

Thereafter, the voltages and the electric charges respectively existed in both the ferroelectric capacitor $C_{ferro}$ and the MOS capacitor $C_{MOS}$ are moved respectively to the point P5 and the point S5 shown in FIG. 6 with the time elapsed. At that time, the voltage at the MOS capacitor $C_{MOS}$, that is the voltage at the floating gate, is detected as the voltage $-V_4$. In other words, the transistor NT is turned into OFF state, just like the state at right before the shut-off of the power supply.

The condition of the voltages and the electric charges existing in the ferroelectric capacitor $C_{ferro}$ is returned to the point P5 from the point P2 as shown in FIG. 6. Similarly, the condition of the voltages and the electric charges existing in the MOS capacitor $C_{MOS}$ is returned to the point S5 from the point S2 through the point S6.

It is understood that the latch circuit LT1 returns to the previous state, that is a state in which the circuit holds the data "High" at right before the shut-off of the power supply, when the power supply is shut off once and is turned on later.

Although, the latch circuit LT1 which latches the data "High" therein is described in the embodiments described above, similar operations are carried out when the latch circuit LT1 latches data "Low" therein. Though, detailed operations of the latch circuit LT1 are described in above, similar operations are carried out by the latch circuit LT2.

The flip-flop circuit 8 is a nonvolatile flip-flop circuit capable of reproducing data upon recovery of the power supply by storing the data during the shut-off of the power regardless of contents of the latched data.

The flip-flop circuit 8 comprises inverter circuits INV1 and INV3 each holding a polarization state corresponding to a signal provided to an output terminal of the transistor GT1 and that of transistor GT2, the inverter circuits INV1 and INV3 being connected respectively to the output terminals.

It is, therefore, the inverter circuits INV1 and INV3 respectively hold the signals provided to the output terminals in a polarization form corresponding to the signals. In this way, the inverter circuits INV1 and INV3 keep holding the data therein even when the power supply is shut off.

As a result, the current state of the flip-flop circuit 8 can be made to the previous state which is right before the shut-off of the power supply quickly with certainty by using the signals held therein when the power supply is in recovery. In other words, a nonvolatile type flip-flop circuit can be realized.

In order to prevent undesirable rewriting of the data thus held through the transistors GT1 and GT2 at the recovery of the power supply, both the transistors GT1 and GT2 are made to OFF state by turning the POR signal into "High" for a time period required for the recovery.

Further, a time period for turning the inverter circuits INV1 and INV3 into polarization states corresponding to the input data D is quite a short period for each of the input data because a time period required for reversing polarization of the ferroelectrics is quite short. This allows the sequential circuit a high speed operation.

Still further, lower voltages can be used for storing/erasing the data into/from the ferroelectrics. It is, therefore, not necessary to provide either of a step-up transformer on the chip or an additional power supply to supply high voltages beside the existing power supply, so that a chip having a compact profile as well as lower manufacturing cost can be achieved.

The flip-flop circuit in this embodiment constituting in such a manner that both the inverter circuits INV1 and INV3 utilizing a pair of ferroelectric transistors are respectively used as ferroelectric memorizing portions, respectively connecting input terminals of the inverter circuits INV1 and INV3 to outputs of the transistors GT1 and GT2, and signals corresponding to the signal provided to output terminals of the inverter circuits INV1 and INV3 are outputted as output data of the inverter circuits INV1 and INV3.

In this way, the signals provided to the output terminals of the transistors GT1 and GT2 included in the flip-flop circuit 8 can be held in ferroelectric transistors by using them for transistors constructing the CMOS inverter circuits. Consequently, a nonvolatile type flip-flop circuit can be realized. The number of the transistors or the like included in the flip-flop circuit may easily be decreased.

The flip-flop circuit in this embodiment is further constituted in such a manner that the inverter circuits INV2 and INV4 for standardizing the signals to predetermined values are provided, and the signals corresponding to the output data are respectively provided in a feed back manner to the output terminals of the transistors GT1 and GT2.

In this way, routine operations and recovery operations can further be stabilized by providing a feed-back path having the inverter circuits INV2 and INV4.

Further, CMOS inverter circuits are used as the inverter circuits INV2 and INV4 in this embodiment. In this way, routine operations and recovery operations can easily be stabilized.

In addition, a pair of transistors included in the inverter circuits INV2 and INV4 are composed respectively of the ferroelectric transistors NT and PT in this embodiment.

In this way, the ferroelectric transistors NT and PT provided in the feed-back path hold the signals provided to the feed-back path in a polarization form corresponding to the signals therein. As a result, the current state of the flip-flop circuit 8 can be made to the previous state which is right before the shut-off of the power supply with higher certainty by using the signals held therein when the power supply is shut off once and then in recovery.

Ferroelectric transistors having a structure so called MFMIS structure are used as the transistors NT and PT in this embodiment.

It is, therefore, a nonvolatile type flip-flop circuit can easily be manufactured by just carrying out additional steps for forming both the ferroelectric layer 32 and the upper conductive layer 34 during manufacturing procedures of a conventional CMOS inverter circuit.

Although, the CMOS inverter circuits using ferroelectric transistors are provided respectively to the latch circuits LT1 and LT2 in the above embodiments, the present invention is not limited to that way. The CMOS inverter circuit using the ferroelectric transistors can be provided to one of the latch circuits LT1 and LT2, for example, only to the latch circuit LT1.

Though, the ferroelectric transistors are provided to both the inverter circuits INV1 and INV2 included in the latch circuit, for example the latch circuit LT1, composing the flip-flop circuit in the above embodiments, the transistors may also be provided to one of the inverter circuits INV1 and INV2, for instance to the inverter circuit INV1 alone.

Further, the ferroelectric transistors may also be provided to the inverter circuit INV2 alone. In this way, power consumption caused by current leakage may be suppressed in a low degree even when the flip-flop circuits are designed to cause the leakage current during the Off-state of either the transistor NT or the transistor PT because the drive capability of current by the inverter circuit INV2 is relatively low.

Although, the ferroelectric transistors are used for both the transistors NT and PT included in the inverter circuit, for example in the inverter circuit INV1 in the embodiments described above, just one ferroelectric transistor can be used for one of the transistors NT and PT, for example to the transistor NT.

Figure 7:
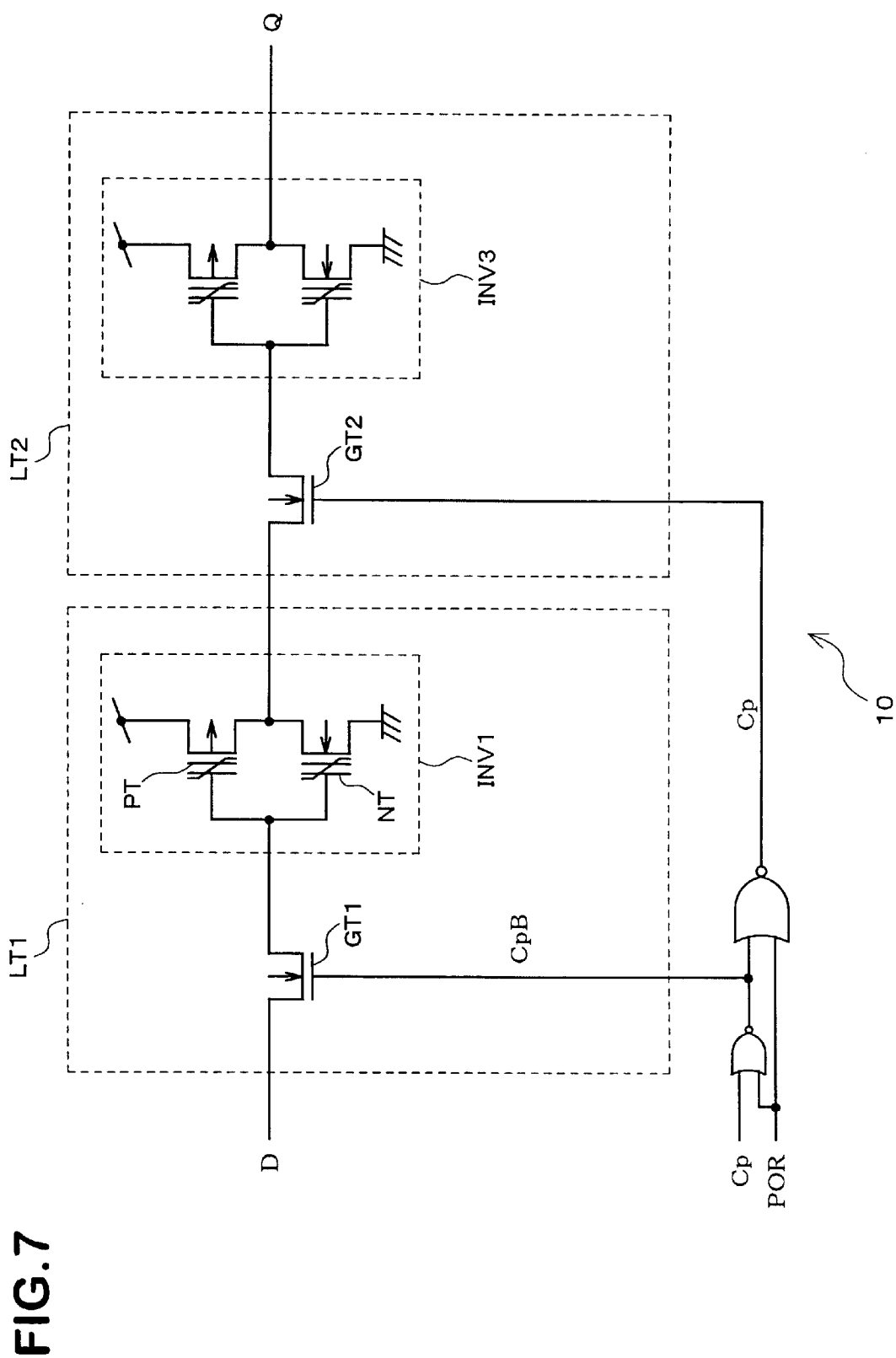
FIG. 7 is a circuit diagram illustrating a flip-flop circuit 10 forming a sequential circuit used in another embodiment of the semiconductor device according to the present invention.

Though, both the inverter circuits INV2 and INV4 for feed-back operations are provided to the flip-flop circuits in the above embodiments, the structure of the flip-flop circuits according to the present invention is not limited to that of the embodiments. For example, both the inverter circuits INV2 and INV4 (see FIG. 1) for feed-back operations may be omitted as well as the latch circuits LT1 and LT2 just like a flip-flop circuit 10 shown in FIG. 7.

The omission is allowed by the following reasons. Existence of parasitic capacitance caused between lines provided in the circuits and the ground permits the electric potentials on the lines for a certain period of time even when the lines are made under the floating state. In this way, the data latched in the latch circuit LT1 and the latch circuit LT2 are held thereby even though both the inverter circuits INV2 and INV4 for feed-back operations are omitted unless cycles of the clock pulse Cp become much longer.

Further, the transistors GT1 and GT2 are used as the gate portion in the above embodiments. The gate portion is not limited to these transistors. Transmission gates, clocked CMOS inverters and some other components may be used for the gate portion.

Each of the variations described above can also be applied to the embodiments will be described hereunder.

Basic D flip-flip circuits are used for describing the above embodiments. The flip-flop circuits used for the present invention are not limited to the basic D flip-flip circuits. The present invention is applicable generally to flip-flop circuits such as a D flip-flop circuit with S-R (set and reset) and, a J-K flip-flop circuit.

Figure 8:
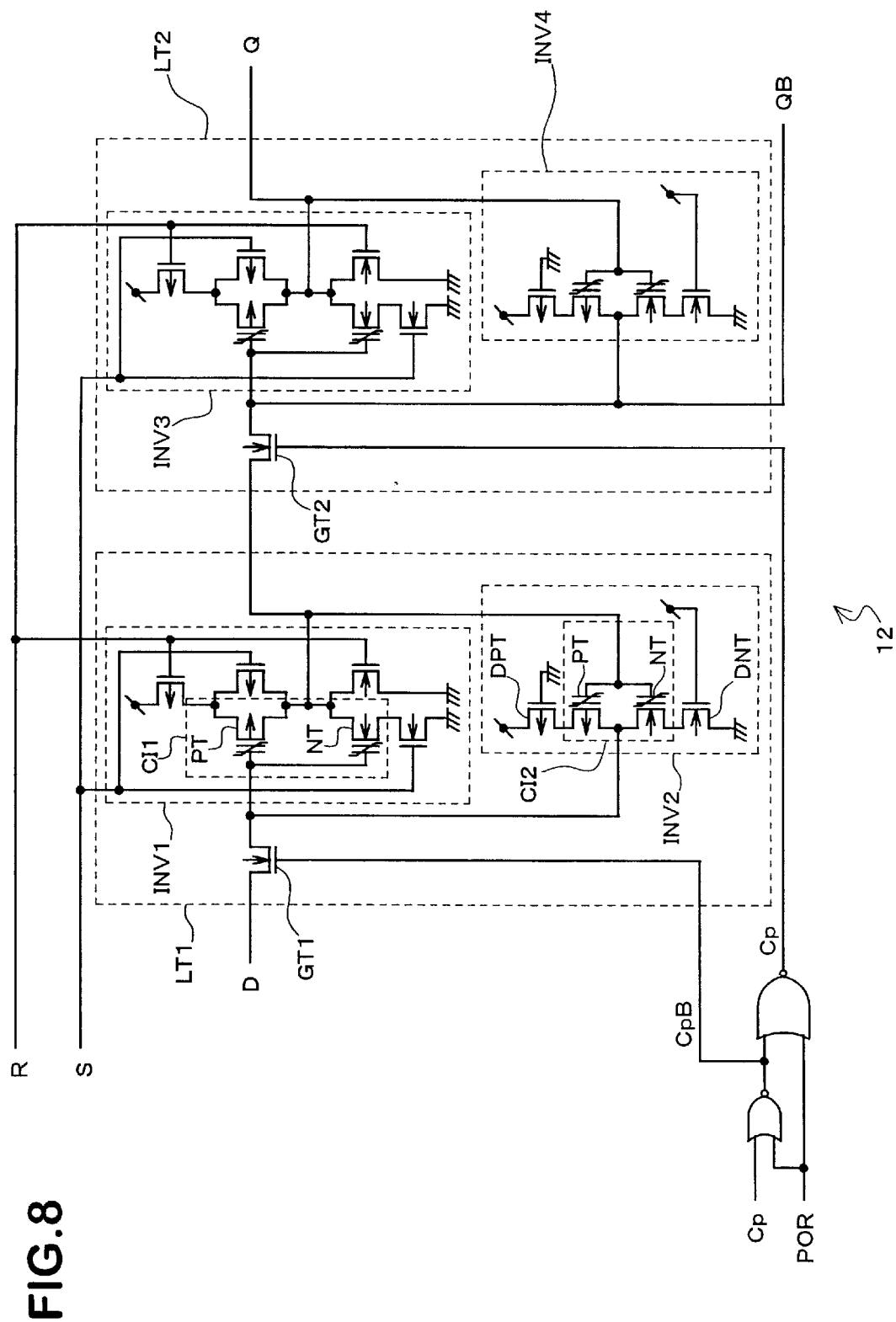
FIG. 8 is a circuit diagram illustrating a flip-flop circuit 12 forming a sequential circuit used in far another embodiment of the semiconductor device according to the present invention.

FIG. 8 is a circuit diagram illustrating a flip-flop circuit 12 as an example of a D flip-flop circuit with S-R (set and reset) according to the present invention. FIG. 9 is a truth table showing the operations of the flip-flop circuit 12.

The flip-flop circuit 12 also comprises the latch circuit LT1 (serves as the master latch circuit) and the latch circuit LT2 (serves as the slave latch circuit) both connected in series similar to the flip-flop circuit 8 shown in FIG. 1.

The inverter circuit INV1 included in the latch circuit LT1 composes a CMOS inverter circuit CI1 comprising both the ferroelectric transistors NT and PT and a total of four transistors. The gates of the four transistors are respectively coupled to a set terminal S and a reset terminal R adequately.

As shown in FIG. 9, data stored in the flip-flop circuit 12 is reset (made to clear) by inputting a signal "High" to the reset terminal R, and the data stored in the flip-flop circuit 12 can be set (preset) by providing a signal "Low" to both the set terminal S and the reset terminal R.

Further, the flip-flop circuit 12 operates in a similar manner to the flip-flop circuit 8 (see FIG. 1) described earlier when the signal "High" is applied to the set terminal S while providing the signal "Low" to the reset terminal R. The POR signal is provided such that the signal is in "High" for a certain period after turning the power supply ON and then become "Low" similar to the flip-flop 8.

The signal "High" is applied to the set terminal S while providing the signal "low" to the reset terminal R during the POR signal is in "High".

The inverter circuit INV2 comprises a CMOS inverter circuit CI2 including both the ferroelectric transistors NT and PT and a total of two transistors DNT and DPT. The power supply voltage is applied to the gate of the transistor DNT, and the gate of the transistor DPT is grounded. The transistors DNT and DPT are used for adjusting electric characteristics of the inverter circuit INV2 with that of the inverter circuit INV1. Both the transistors DNT and DPT may be omitted.

The structure of the latch circuit LT2 is similar to that of the latch circuit LT1, and both the inverter circuit INV3 and INV4 are included therein. The structure of both the inverter circuits INV3 and INV4 is similar to that of the inverter circuits INV1 and INV2.

The flip-flop circuit 12 has the similar structure to the flip-flop circuit 8 shown in FIG. 1 except that the flip-flop 12 includes both the set terminal S and the reset terminal R as well as having the inverter circuits INV1 through INV4 slightly complex in their structures.

Figures 10A, 10B:
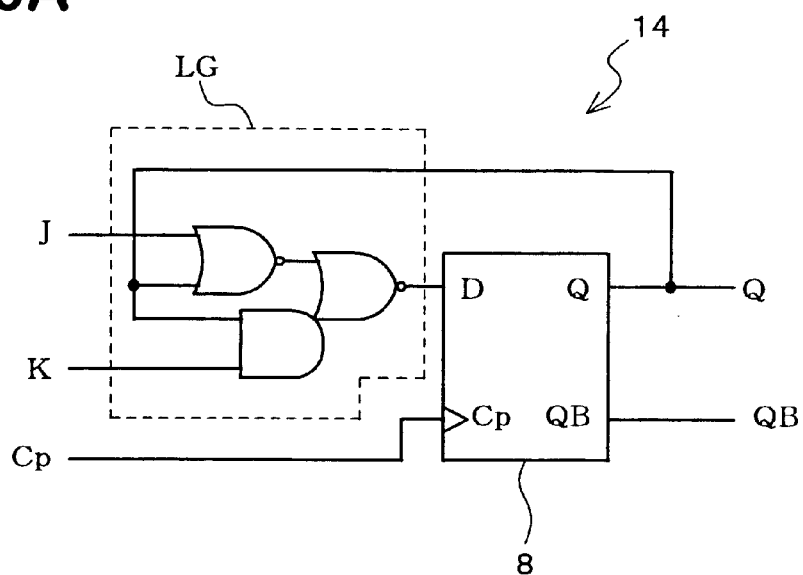
FIG. 10A is a circuit diagram of a flip-flop circuit 14 as an example of the J-K flip-flop circuit using the present invention.
FIG. 10B is a truth table showing the operating conditions of the flip-flop circuit 14.

FIG. 10A is a circuit diagram of a flip-flop circuit 14 as an example of the J-K flip-flop circuit using the present invention. FIG. 10B is a truth table showing the operations of the flip-flop circuit 14.

The flip-flop circuit 14 comprises the flip-flop circuit 8 shown in FIG. 1 and a logic gate portion LG combining a plurality of logic gates. Input signals provided through input terminals J and K and another input signal from the output terminal Q of the flip-flop 8 are supplied to the logic gate portion LG. The output of the logic gate portion LG is provided to the input terminal D of the flip-flop circuit 8.

Data "High" is outputted from the output terminal Q at the positive edge of the clock pulse CP when the signal "Low" is applied to the input terminal K while providing the signal "High" to the input terminal J as shown in FIG. 10B. On the contrary, data "Low" is outputted from the output terminal Q at the positive edge of the clock pulse CP when the signal "High" is applied to the input terminal K while providing the signal "Low" to the input terminal J.

The inverted output signal is outputted at the positive edge of the clock pulse Cp when the signal "High" is applied to both the input terminals K and J. On the other hand, the output signal is remained the same when the signal "Low" is applied to both the input terminals K and J.

Although, flip-flop circuits are used as the sequential circuit in the above embodiments, the sequential circuit according to the present invention is not limited to the flip-flop circuits. The present invention is applicable to other circuits such as latch circuits.

Figures 11A, 11B:
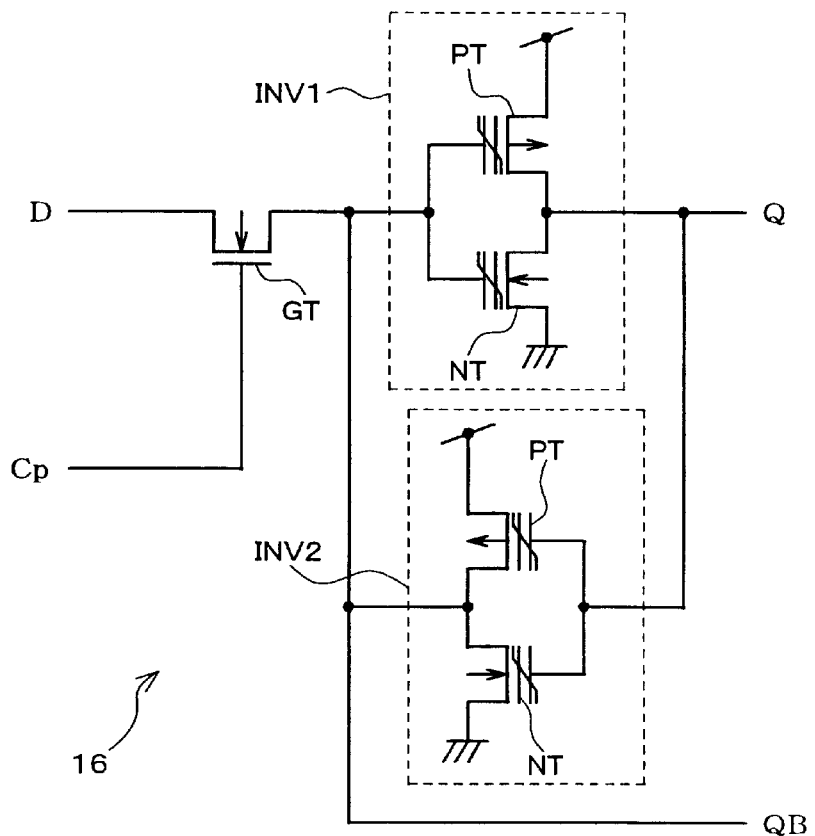
FIG. 11A is a circuit diagram of a latch circuit 16 as an example of a latch circuit using the present invention.
FIG. 11B is a truth table showing the operating conditions of the latch circuit 16.

FIG. 11A is a circuit diagram of a latch circuit 16 as an example of the latch circuit using the present invention. FIG. 11B is a truth table showing the operations of the latch circuit 16. The latch circuit 16 has the similar structure to the latch circuit LT1 composing the flip-flop circuit 8 shown in FIG. 1.

In other words, the latch circuit 16 comprises a transistor GT (an N channel MOSFET) forming a gate portion, inverter circuits INV1 and INV2. The inverter circuit INV1 is composed of a CMOS inverter circuit in which a transistor NT made of a P channel MOSFET is connected to a transistor NT composed of an N channel MOSFET in series.

Both the transistor NT and the transistor PT are ferroelectric transistors having a structure so called MFMIS structure. Both the transistors NT and PT have the same structure except that one of them is an N channel type MOSFET and the other is a P channel type MOSFET. The structure of the inverter circuit INV2 is also similar to that of the inverter circuit INV1.

In this embodiment, the inverter circuit INV1 and the inverter circuit INV2 respectively form a ferroelectric memorizing portion and a feed-back circuit.

An input data D inputted through the transistor GT is inverted with the inverter circuit INV1, then the inverted data is inverted again (it is made to the inputted data D) with the inverter circuit INV2. The resultant data is provided to the inverter circuit INV1. In other words, data can be held with a high stability by using the feed-back circuit including the inverter circuit INV2. This function is used in the latch circuit LT1 (see FIG. 1) described above.

The output of the inverter circuit INV1 is an output data Q of the latch circuit 16. Further, the output of the inverter circuit INV2 is an inverted output data QB of the latch circuit 16. Clock pulses CP serve as a gate control signal are provided to the gate of the transistor GT in the latch circuit 16.

The input data D is outputted from the output terminal Q as it is when the clock pulse Cp is in "High" as shown in FIG. 11B. In other words, the latch circuit 16 is in unlatched-state. On the contrary, the value of the output data remains the same when the clock pulse Cp is in "Low", that is, the latch circuit 16 is in latched-state.

The latch circuit 16 is capable of holding data even when the power supply is shut off and capable of recovering a state to the state which is right before the shut-off of the power supply similar to the flip-flop circuits described earlier.

Although, sequential circuits are exampled in the embodiments described above, the application of the present invention is not limited to sequential circuits. The present invention is applicable to other circuits such as CMOS inverter circuits.

Figures 12A, 12B:
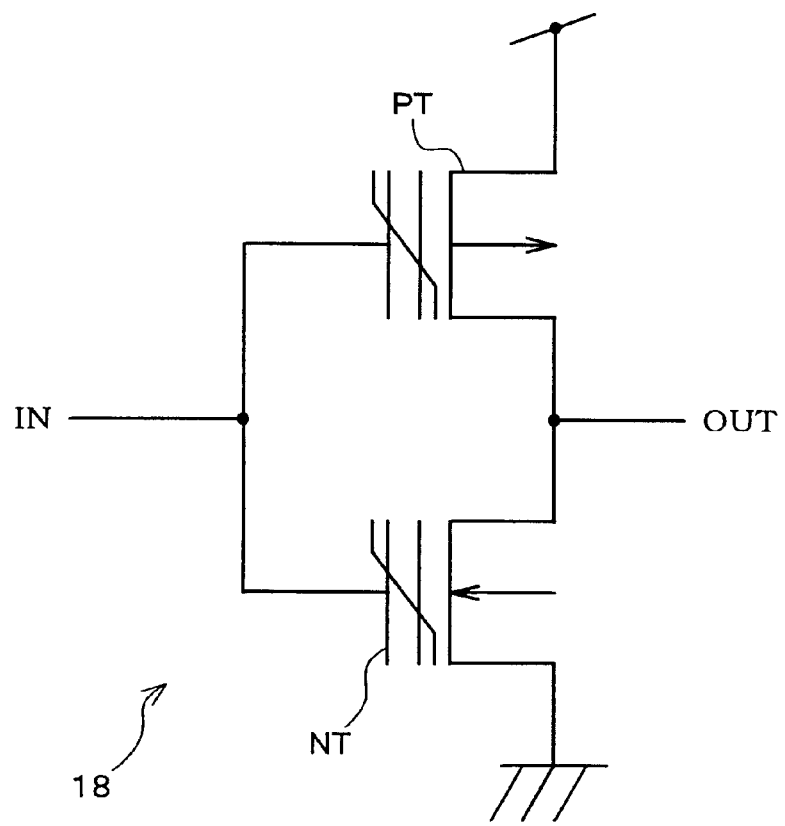
FIG. 12A is a circuit diagram of an inverter circuit 18 as an example of a CMOS inverter circuit using the present invention.
FIG. 12B is a truth table showing the operating conditions of the inverter circuit 18.

FIG. 12A is a circuit diagram of an inverter circuit 18 as an example of a CMOS inverter circuit using the present invention. FIG. 12B is a truth table showing the operations of the inverter circuit 18.

The inverter circuit 18 has almost the same structure to that of the inverter circuit INV1 included in the flip-flop circuit 8 shown in FIG. 1.

In other words, the inverter circuit 18 comprises a transistor PT made of P channel MOSFET connected to a transistor NT of an N channel MOSFET in series. Both the transistor NT and the transistor PT are ferroelectric transistors having a structure so called MFMIS structure. Both the transistors NT and PT have the same structures except that one of them is an N channel type MOSFET and the other is a P channel type MOSFET.

The data inverting an input data IN is the output data OUT as shown in FIG. 12B. Similar to the above embodiments, the inverter circuit 18 is also capable of holding data during the shut off of the power supply and capable of recovering a state to the state which is right before the shut-off of the power supply quickly with certainty when the power supply is in recovery.

Although, ferroelectric transistors having a structure so called MFMIS structure are used as the ferroelectric transistors in the embodiments described above, the application of the present invention is not limited to the MFMIS-structured ferroelectric transistors. The present invention may also be applicable to other ferroelectric transistors such as a transistor NT shown in FIG. 13A.

Figure 13A:
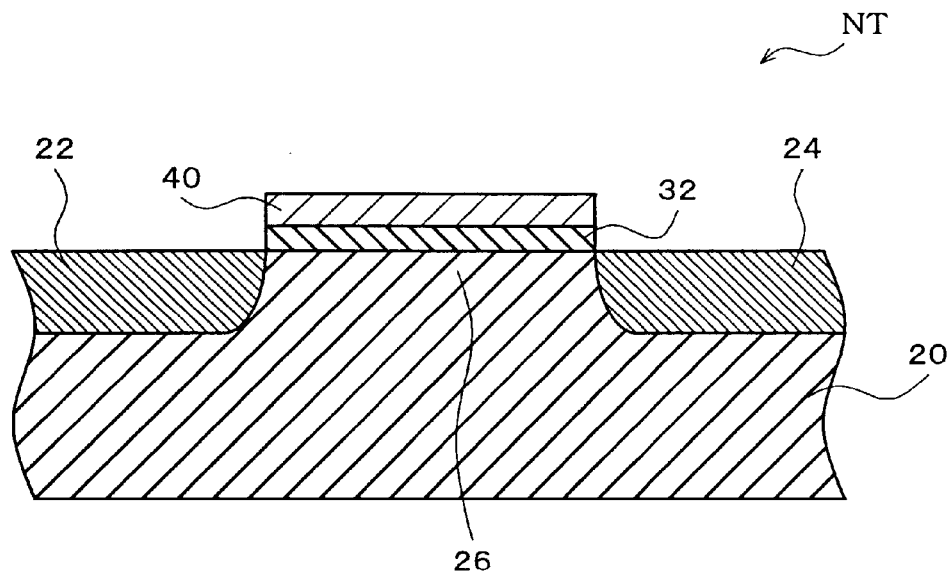
FIG. 13A is a sectional view illustrating a modified structure of the transistor NT.

The transistor NT shown in FIG. 13A is an N channel MOSFET. In the transistor NT, a source region 22 and a drain region 24 both made of an n-type semiconductor are formed in a p-type semiconductor substrate 20 forming a semiconductor substrate. On a channel region 26 made of a p-type semiconductor, a ferroelectric layer 32 composed of ferroelectric materials such as PZT and the like is formed. A conductive layer 40 is located on the ferroelectric layer 32.

The transistor formed of a metal layer, a ferroelectric layer, and a silicon layer one after another from the top in that order, is referred to as an MFS-structured transistor. Beside the MFS-structured transistor, an MFIS-structured transistor interposing an insulation layer between the ferroelectric layer and the silicon layer of the MFS-structured transistor may also be used.

Figure 13B:
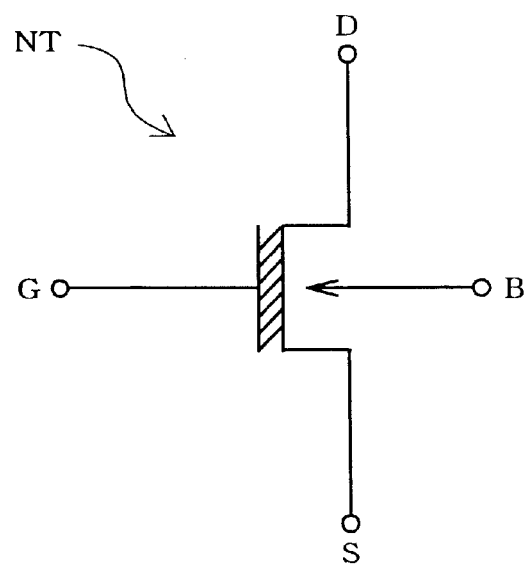
FIG. 13B is a view illustrating a schematic symbol of the modified transistor NT shown in FIG. 13A.

FIG. 13B is a view illustrating a schematic symbol of the transistor NT shown in FIG. 13A. A gate electrode G is connected to the conductive layer 40. A source electrode S and a drain electrode D are respectively connected to the source region 22 and the drain region 24.

The transistor NT is fabricated by substituting an insulation layer made of silicon oxides in a conventional MOSFET with a layer made of ferroelectric such as PZT and the like. In this way, a nonvolatile type sequential circuit can be produced easily by changing a part of the materials of memory transistors used for the conventional SRAMs. A transistor having similar structure with the transistor NT shown in FIG. 13A may be used as the transistor PT which is a P channel MOSFET.

Although, ferroelectric transistors are used as the ferroelectric memorizing portion in the above embodiments, the ferroelectric memorizing portion is not limited to the ferroelectric transistors. Ferroelectric capacitors can also be used as the ferroelectric memorizing portion. In that case, a conventional MOSFET connecting a ferroelectric capacitor to its gate electrode may be used instead of the ferroelectric transistor NT shown in FIG. 1.

In this way, a nonvolatile type flip-flop circuit can be realized easily by just providing additional ferroelectric capacitors to the conventional MOSFET used for the prior art flip-flop circuits without any modifications.

The present invention is characterized in that, the sequential circuit comprises a ferroelectric memorizing portion connected to an output terminal of the gate portion and holding a polarization state corresponding to a signal provided to the output terminal.

In this way, the ferroelectric memorizing portion holds the signal provided to the output terminal of the gate portion included in the sequential circuit such as a latch circuit as a polarization state corresponding to the signals. Consequently, the ferroelectric memorizing portion keep holding the data therein even when the power supply is shut off.

As a result, the current state of the sequential circuit can be made to the previous state which is right before the shut-off of the power supply quickly with certainty by using the data held therein when the power supply is in recovery. In other words, a nonvolatile type flip-flop circuit can be realized.

Also, the present invention is characterized in that, a complementary metal-oxide-semiconductor (CMOS) inverter circuit, including a plurality of transistors at least one of the transistors being a ferroelectric transistor, is used as the ferroelectric memorizing portion, and an input terminal of the inverter circuit is connected to the output terminal of the gate portion, and a signal corresponding to output data provided to an output terminal of the inverter circuit is outputted as output data of the sequential circuit.

In this way, the signal provided to the output terminal of the gate portion included in the sequential circuit can be held in ferroelectric transistors by using them for the transistors included in the complementary metal-oxide-semiconductor (CMOS) inverter circuit. Consequently, a nonvolatile sequential circuit can be realized. In addition, the number of the transistors included in the sequential circuit can be decreased.

Further, the present invention is characterized in that, the sequential circuit further comprises a feed-back circuit through which a signal corresponding to the output data is provided to the output terminal of the gate portion in a feed-back manner.

In this way, routine operations and recovery operations can further be stabilized by providing a feed-back path to the sequential circuit.

The present invention is also characterized in that, a complementary metal-oxide-semiconductor (CMOS) inverter circuit is used as the feed-back circuit. In other words, routine operations and recovery operations can easily be stabilized by using the complementary metal-oxide-semiconductor (CMOS) inverter circuit as the feed-back circuit.

The present invention is further characterized in that, at least one transistor included in the complementary metal-oxide-semiconductor (CMOS) inverter circuit which is used as the feed-back circuit is formed of a ferroelectric transistor.

In this way, the ferroelectric transistor provided in the feed-back path holds the signal provided to the feed-back path in a polarization form corresponding to signal therein. As a result, the current state of the sequential circuit can be made to the previous state which is right before the shut-off of the power supply quickly with higher certainty by using the signal held therein when the power supply is shut off once and then in recovery.

The present invention is still characterized in that, the ferroelectric transistor includes;

A) a source region and a drain region composed of a first conductive type semiconductor, both formed in a semiconductor substrate, B) a channel region composed of a second conductive type semiconductor disposed between the source region and the drain region, C) an insulation layer located on the channel region, D) a first conductive layer formed on the insulation layer, E) a ferroelectric layer disposed on the first conductive layer, and F) a second conductive layer located on the ferroelectric layer.

It is, therefore, a nonvolatile sequential circuit can easily be manufactured by just carrying out additional step for forming both the ferroelectric layer and the second conductive layer during manufacturing procedures of a conventional CMOS inverter circuit.

The present invention is characterized in that, the sequential circuit system combining a first sequential circuit and a second sequential circuit in series, each of the sequential circuits having a gate portion for switching input data according to a gate control signal provided thereto, the sequential circuit outputting a signal corresponding to the input data as output data when the gate portion is in an ON-state, the sequential circuit holding input data which is inputted substantially at right before an OFF-state of the gate portion while outputting a signal corresponding to the input data held therein as output data when the gate portion is in the OFF-state, wherein at least one of the sequential circuits comprises a ferroelectric memorizing portion connected to an output terminal of the gate portion and holding a polarization state corresponding to a signal provided to the output terminal, and wherein output data of the first sequential circuit, which directly receives incoming data to the sequential circuit system, is provided to the gate portion of the second sequential circuit as input data of the second sequential circuit which outputs outgoing data of the sequential circuit system, and wherein the gate control signal for controlling the gate portion of the first sequential circuit and the gate control signal for controlling the gate portion of the second sequential circuit are provided so as to reverse in phase.

In this way, the ferroelectric memorizing portion holds the signal provided to the output terminal of the gate portion in a polarization form corresponding to the signal, the gate portion included in at least one of the sequential circuits such as two latch circuits both composing the sequential circuit system such as a flip-flop circuit. Consequently, the ferroelectric portion keep holding the data therein even when the power supply is shut off.

As a result, the current state of the sequential circuit such as a latch circuit can be made to the previous state which is right before the shut-off of the power supply quickly with certainty by using the data held therein when the power supply is in recovery. In other words, a nonvolatile type flip-flop circuit can be realized.

Also, the present invention is characterized in that, in a complementary metal-oxide-semiconductor inverter circuit connecting a p-channel metal-oxide-semiconductor field effect type transistor and an N-channel metal-oxide-semiconductor field effect type transistor in series, wherein at least one of the transistors is formed of a ferroelectric transistor.

In this way, the signal provided to the inverter circuit is held in the ferroelectric transistor in a polarization form corresponding to the signal. Consequently, the ferroelectric memorizing portion keep holding the data therein even when the power supply is shut off.

As a result, the current state of the inverter circuit can be made to the previous state which is right before the shut-off of the power supply quickly with certainty by using the data held therein when the power supply is in recovery. In other words, a nonvolatile inverter circuit can be realized.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A sequential circuit having a gate portion for switching input data according to a gate control signal provided thereto, the sequential circuit outputting a signal corresponding to the input data as output data when the gate portion is in an ON-state, the sequential circuit holding input data which is inputted substantially at right before an OFF-state of the gate portion while outputting a signal corresponding to the input data held therein as output data when the gate portion is in the OFF-state, the sequential circuit comprising:

a ferroelectric memorizing portion connected to an output terminal of the gate portion and holding a polarization state corresponding to a signal provided to the output terminal.

2. A sequential circuit system combining a first sequential circuit and a second sequential circuit in series, each of the sequential circuits having a gate portion for switching input data according to a gate control signal provided thereto, the sequential circuit outputting a signal corresponding to the input data as output data when the gate portion is in an ON-state, the sequential circuit holding input data which is inputted substantially at right before an OFF-state of the gate portion while outputting a signal corresponding to the input data held therein as output data when the gate portion is in the OFF-state, wherein at least one of the sequential circuits is composed of a sequential circuit defined in claim 1, and wherein output data of the first sequential circuit, which directly receives incoming data to the sequential circuit system, is provided to the gate portion of the second sequential circuit as input data of the second sequential circuit which outputs outgoing data of the sequential circuit system, and wherein the gate control signal for controlling the gate portion of the first sequential circuit and the gate control signal for controlling the gate portion of the second sequential circuit are provided so as to reverse in phase.

3. A semiconductor device including a sequential circuit defined in claim 1.

4. A sequential circuit in accordance with claim 1, wherein a complementary metal-oxide-semiconductor inverter circuit including a plurality of transistors is used as the ferroelectric memorizing portion, at least one of the transistors being ferroelectric transistor, and wherein an input terminal of the inverter circuit is connected to the output terminal of the gate portion, and wherein a signal corresponding to output data provided to an output terminal of the inverter circuit is outputted as output data of the sequential circuit.

5. A sequential circuit in accordance with claim 4, wherein the ferroelectric transistor includes;

A) a source region and a drain region composed of a first conductive type semiconductor, both formed in a semiconductor substrate, B) a channel region composed of a second conductive type semiconductor disposed between the source region and the drain region, C) an insulation layer located on the channel region, D) a first conductive layer formed on the insulation layer, E) a ferroelectric layer disposed on the first conductive layer, and F) a second conductive layer located on the ferroelectric layer.

6. A sequential circuit system combining a first sequential circuit and a second sequential circuit in series, each of the sequential circuits having a gate portion for switching input data according to a gate control signal provided thereto, the sequential circuit outputting a signal corresponding to the input data as output data when the gate portion is in an ON-state, the sequential circuit holding input data which is inputted substantially at right before an OFF-state of the gate portion while outputting a signal corresponding to the input data held therein as output data when the gate portion is in the OFF-state, wherein at least one of the sequential circuits is composed of a sequential circuit defined in claim 4, and wherein output data of the first sequential circuit, which directly receives incoming data to the sequential circuit system, is provided to the gate portion of the second sequential circuit as input data of the second sequential circuit which outputs outgoing data of the sequential circuit system, and wherein the gate control signal for controlling the gate portion of the first sequential circuit and the gate control signal for controlling the gate portion of the second sequential circuit are provided so as to reverse in phase.

7. A semiconductor device including a sequential circuit defined in claim 4.

8. A sequential circuit in accordance with claim 1, wherein the sequential circuit further comprises a feed-back circuit through which a signal corresponding to the output data is provided to the output terminal of the gate portion in a feed-back manner.

9. A sequential circuit system combining a first sequential circuit and a second sequential circuit in series, each of the sequential circuits having a gate portion for switching input data according to a gate control signal provided thereto, the sequential circuit outputting a signal corresponding to the input data as output data when the gate portion is in an ON-state, the sequential circuit holding input data which is inputted substantially at right before an OFF-state of the gate portion while outputting a signal corresponding to the input data held therein as output data when the gate portion is in the OFF-state, wherein at least one of the sequential circuits is composed of a sequential circuit defined in claim 8, and wherein output data of the first sequential circuit, which directly receives incoming data to the sequential circuit system, is provided to the gate portion of the second sequential circuit as input data of the second sequential circuit which outputs outgoing data of the sequential circuit system, and wherein the gate control signal for controlling the gate portion of the first sequential circuit and the gate control signal for controlling the gate portion of the second sequential circuit are provided so as to reverse in phase.

10. A semiconductor device including a sequential circuit defined in claim 8.

11. A sequential circuit in accordance with claim 8, wherein a complementary metal-oxide-semiconductor inverter circuit is used as the feed-back circuit.

12. A sequential circuit system combining a first sequential circuit and a second sequential circuit in series, each of the sequential circuits having a gate portion for switching input data according to a gate control signal provided thereto, the sequential circuit outputting a signal corresponding to the input data as output data when the gate portion is in an ON-state, the sequential circuit holding input data which is inputted substantially at right before an OFF-state of the gate portion while outputting a signal corresponding to the input data held therein as output data when the gate portion is in the OFF-state, wherein at least one of the sequential circuits is composed of a sequential circuit defined in claim 11, and wherein output data of the first sequential circuit, which directly receives incoming data to the sequential circuit system, is provided to t he gate portion of the second sequential circuit as input data of the second sequential circuit which outputs outgoing data of the sequential circuit system, and wherein the gate control signal for controlling the gate portion of the first sequential circuit and the gate control signal for controlling the gate portion of the second sequential circuit are provided so as to reverse in phase.

13. A semiconductor device including a sequential circuit defined in claim 11.

14. A sequential circuit in accordance with claim 11, wherein at least one transistor included in the complementary metal-oxide-semiconductor inverter circuit which is used as the feed-back circuit is formed of a ferroelectric transistor.

15. A sequential circuit in accordance with claim 14, wherein the ferroelectric transistor includes;

A) a source region and a drain region composed of a first conductive type semiconductor, both formed in a semiconductor substrate, B) a channel region composed of a second conductive type semiconductor disposed between the source region and the drain region, C) an insulation layer located on the channel region, D) a first conductive layer formed on the insulation layer, E) a ferroelectric layer disposed on the first conductive layer, and F) a second conductive layer located on the ferroelectric layer.

16. A semiconductor device including a sequential circuit defined in claim 15.

17. A sequential circuit system combining a first sequential circuit and a second sequential circuit in series, each of the sequential circuits having a gate portion for switching input data according to a gate control signal provided thereto, the sequential circuit outputting a signal corresponding to the input data as output data when the gate portion is in an ON-state, the sequential circuit holding input data which is inputted substantially at right before an OFF-state of the gate portion while outputting a signal corresponding to the input data held therein as output data when the gate portion is in the OFF-state, wherein at least one of the sequential circuits is composed of a sequential circuit defined in claim 14, and wherein output data of the first sequential circuit, which directly receives incoming data to the sequential circuit system, is provided to the gate portion of the second sequential circuit as input data of the second sequential circuit which outputs outgoing data of the sequential circuit system, and wherein the gate control signal for controlling the gate portion of the first sequential circuit and the gate control signal for controlling the gate portion of the second sequential circuit are provided so as to reverse in phase.

18. A semiconductor device including a sequential circuit defined in claim 14.

* * * * *